(12) United States Patent
Soga (10) Patent No.: US 11,202,016 B2
(45) Date of Patent: Dec. 14, 2021

(54) IMAGING DEVICE (71) Applicant: OLYMPUS CORPORATION, Hachioji (JP)

(72) Inventor: Takumi Soga, Sagamihara (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 17/126,381

(22) Filed: Dec. 18, 2020

(65) Prior Publication Data
US 2021/0105396 A1  Apr. 8, 2021

Related U.S. Application Data (63) Continuation of application No. PCT/JP2018/026462, filed on Jul. 13, 2018.

(51) Int. Cl.
H04N 5/235 (2006.01)
G03B 15/03 (2021.01)
H04N 5/225 (2006.01)

(52) U.S. Cl.
CPC .......... H04N 5/2354 (2013.01); G03B 15/03 (2013.01); H04N 5/2256 (2013.01); H04N 5/2351 (2013.01)

(58) Field of Classification Search
CPC .. H04N 5/2354; H04N 5/2256; H04N 5/2351; H04N 5/23241; G03B 15/03; H05B 45/46; H05B 45/3725; H01L 33/00
See application file for complete search history.

(56) References Cited

U.S. PATENT DOCUMENTS

2009/0295775 A1  12/2009  Kim et al.
2010/0219773 A1*  9/2010  Nakai .................... H05B 45/46
                                              315/307

FOREIGN PATENT DOCUMENTS

JP  2005-116738 A  4/2005
JP  2008-224432 A  9/2008
(Continued)

OTHER PUBLICATIONS

International Search Report dated Aug. 28, 2018, issued in counterpart application No. PCT/JP2018/026462, w/English translation (4 pages).

Primary Examiner — Nelson D. Hernández Hernández
(74) Attorney, Agent, or Firm — Westerman, Hattori, Daniels & Adrian, LLP (57) ABSTRACT An imaging device according to an embodiment includes an imaging circuit, a variable-voltage power source, a light-emitting element, a constant current-driving circuit, and a control circuit. The control circuit is configured to turn on the light-emitting element in a period during which the imaging circuit performs imaging. The control circuit is configured to turn off the light-emitting element in a period during which the imaging circuit does not perform imaging. The control circuit is configured to control voltage applied to the light-emitting element by the variable-voltage power source on the basis of voltage of an input terminal of the constant current-driving circuit when the light-emitting element is turned on. The control circuit is configured to control the variable-voltage power source and apply predetermined voltage greater than or equal to compliance voltage of the light-emitting element to the light-emitting element when the light-emitting element is turned off.

5 Claims, 7 Drawing Sheets

(56) References Cited

FOREIGN PATENT DOCUMENTS

| | | | |
|---|---|---|---|
| JP | 2008-305978 | A | 12/2008 |
| JP | 2009-054816 | A | 3/2009 |
| JP | 4246029 | B2 | 4/2009 |
| JP | 2010-011012 | A | 1/2010 |
| JP | 2010-123900 | A | 6/2010 |
| JP | 2010-177531 | A | 8/2010 |
| JP | 2010-183043 | A | 8/2010 |
| JP | 5032893 | B2 | 9/2012 |
| WO | 2016/104386 | A1 | 6/2016 |

* cited by examiner

IMAGING DEVICE

The present application is a continuation application based on International Patent Application No. PCT/JP2018/026462 filed on Jul. 13, 2018, the content of which is incorporated herein by reference.

BACKGROUND OF THE INVENTION

Field of the Invention

The present invention relates to an imaging device.

Description of Related Art

In an illumination device using a semiconductor light-emitting element, a driving circuit that causes current to flow in the semiconductor light-emitting element is known.

Figure 7A:
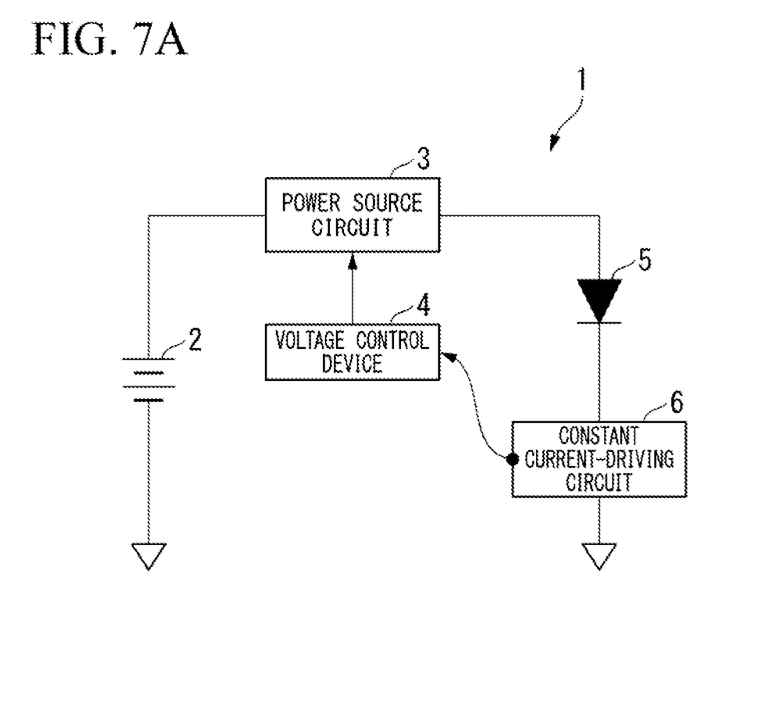
FIG. 7A is a block diagram showing a schematic configuration of an illumination device that controls the light emission of a semiconductor light-emitting element.

FIG. 7A shows a block diagram showing a schematic configuration of an illumination device that controls light emission of a semiconductor light-emitting element. The illumination device 1 shown in FIG. 7A includes a battery 2, a power source circuit 3, a voltage control circuit 4, a light-emitting element 5, and a constant current-driving circuit 6.

The power source circuit 3 converts the direct-current (DC) voltage accumulated in the battery 2 into power source voltage and applies the converted power source voltage VDD to the light-emitting element 5.

The constant current-driving circuit 6 drives the light-emitting element 5 and causes the light-emitting element 5 to emit light.

The voltage control circuit 4 properly controls the power source voltage VDD applied to the light-emitting element 5 by the power source circuit 3 in order to minimize the amount of power loss in the constant current-driving circuit 6 when the constant current-driving circuit 6 drives the light-emitting element 5.

Figure 7B:
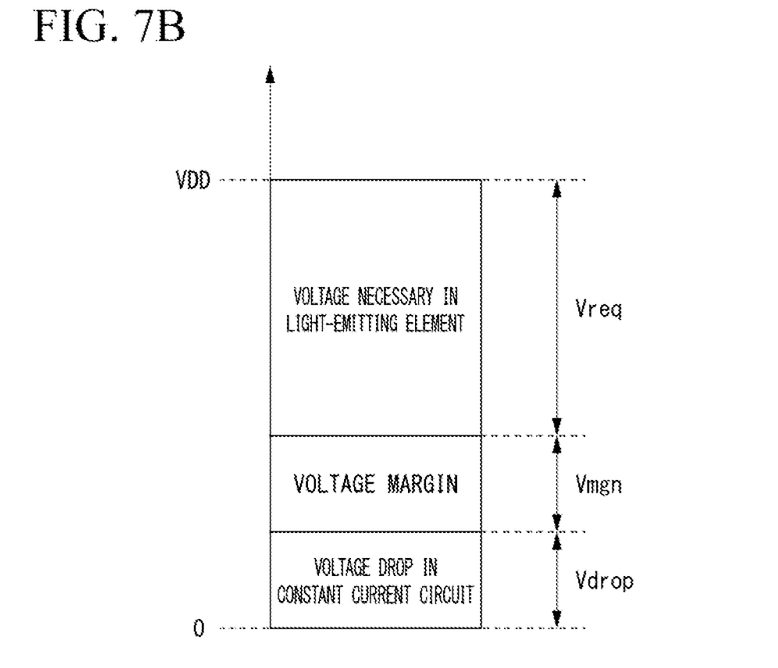
FIG. 7B is a diagram showing the power source voltage VDD necessary in the light-emitting element 5 shown in FIG. 7A.

FIG. 7B shows a diagram showing the power source voltage VDD necessary in the light-emitting element 5 shown in FIG. 7A.

The power source voltage VDD necessary for light emission of the light-emitting element 5 is the sum of the voltage (voltage Vreq necessary for the light emission of the light-emitting element 5) necessary in the light-emitting element and the voltage drop (voltage drop Vdrop of the constant current-driving circuit 6) of the constant current circuit. The voltage Vreq necessary for the light emission of the light-emitting element 5 is the forward voltage (voltage called Vf or compliance voltage) of the light-emitting element 5.

Here, if the power source voltage VDD is too low, it is impossible to cause the necessary current to flow in the light-emitting element 5. Therefore, it is necessary to keep the power source voltage VDD relatively high. In other words, it is necessary to add voltage margin Vmgn to the power source voltage VDD. Thus, the power source voltage VDD necessary for the light emission of the light-emitting element 5 is the sum of the voltage Vreq necessary for the light emission of the light-emitting element 5, the voltage margin Vmgn, and the voltage drop Vdrop as shown in FIG. 7B.

On the other hand, if the power source voltage VDD is too high, sufficient amount of current flows. However, the sum of the voltage margin Vmgn and the voltage drop Vdrop leads to the power loss (heat generation) in the constant current-driving circuit 6.

In other words, it is necessary to cause the voltage margin Vmgn to be the minimal power source voltage VDD by controlling the power source voltage VDD in order to minimize the amount of power loss in the constant current-driving circuit 6.

However, since the deviation occurs in the forward voltage of the light-emitting element 5 due to the individual difference of the device, aging deterioration, operating temperature, or the like, it is impossible to uniquely determine the power source voltage VDD. Therefore, feedback control of controlling the power source voltage VDD to be proper voltage is required. Controlling the voltage to be proper voltage means that the voltage margin Vmgn is controlled to be small at all times in FIG. 7B.

A control method related to controlling the power source voltage VDD is proposed, for example, in the following prior art documents. In the control method disclosed in Japanese Unexamined Patent Application, First Publication No. 2008-305978, the difference between the voltage of the gate and the source of the FET (M1) is detected and the power source voltage VDD is controlled (see FIG. 1 of Japanese Unexamined Patent Application, First Publication No. 2008-305978). In addition, the control method disclosed in Japanese Unexamined Patent Application, First Publication No. 2005-116738, the output of the operational amplifier 4, that is, the gate voltage of the FET 5 is detected and the power source voltage VDD is controlled (see FIG. 2 of Japanese Unexamined Patent Application, First Publication No. 2005-116738).

SUMMARY OF THE INVENTION

According to a first aspect of the present invention, an imaging device includes an imaging circuit, a variable-voltage power source, a light-emitting element, a constant current-driving circuit, and a control circuit. An output terminal of the variable-voltage power source is connected to an input terminal of the light-emitting element. An output terminal of the light-emitting element is connected to an input terminal of the constant current-driving circuit. The control circuit is configured to output a pulse-width modulation signal to the constant current-driving circuit and control current flowing into the constant current-driving circuit so as to turn on the light-emitting element in a period during which the imaging circuit performs imaging. The control circuit is configured to stop outputting the pulse-width modulation signal to the constant current-driving circuit so as to turn off the light-emitting element in a period during which the imaging circuit does not perform imaging. The control circuit is configured to change driving voltage applied to the light-emitting element by the variable-voltage power source and perform control of causing the driving voltage to near predetermined power source voltage on the basis of voltage of the input terminal of the constant current-driving circuit in a period during which the light-emitting element is maintained to be turned on. The control circuit is configured to control the variable-voltage power source and apply predetermined voltage greater than or equal to compliance voltage of the light-emitting element to the light-emitting element in a period during which the light-emitting element is maintained to be turned off.

According to a second aspect of the present invention, in the first aspect, the imaging device further includes a wave-detection circuit configured to calculate brightness of an image obtained through the imaging performed by the imaging circuit. The control circuit is configured to determine whether or not to increase current flowing in the light-emitting element on the basis of the brightness. The control circuit is configured to control the driving voltage and apply voltage greater than the compliance voltage to the light-emitting element in a period during which the light-emitting element is maintained to be turned off when the control circuit determines that the current is to be increased.

According to a third aspect of the present invention, in the second aspect, the imaging device further includes a memory configured to store information indicating a relationship between the brightness and a value of voltage applied by the variable-voltage power source. The control circuit is configured to identify the voltage applied by the variable-voltage power source on the basis of the brightness and the information. The control circuit is configured to apply the identified voltage to the light-emitting element in the period during which the light-emitting element is maintained to be turned off.

According to a fourth aspect of the present invention, in the first aspect, the imaging device further includes a voltage clip circuit disposed between the input terminal of the constant current-driving circuit and an input terminal of a comparator used when the control circuit controls the driving voltage. The voltage clip circuit is configured to clip voltage of the input terminal of the comparator to be predetermined voltage.

According to a fifth aspect of the present invention, in the first aspect, the control circuit is configured to apply, in the period during which the light-emitting element is maintained to be turned off, voltage applied to the light-emitting element at the end of a turn-on period of last time in which the light-emitting element is maintained to be turned on to the light-emitting element as the predetermined voltage. The control circuit is configured to apply, in the turn-on period of next time, the voltage applied to the light-emitting element at the end of the turn-on period of last time to the light-emitting element, thus resuming light emission.

DETAILED DESCRIPTION OF THE INVENTION

First Embodiment

Figure 1:
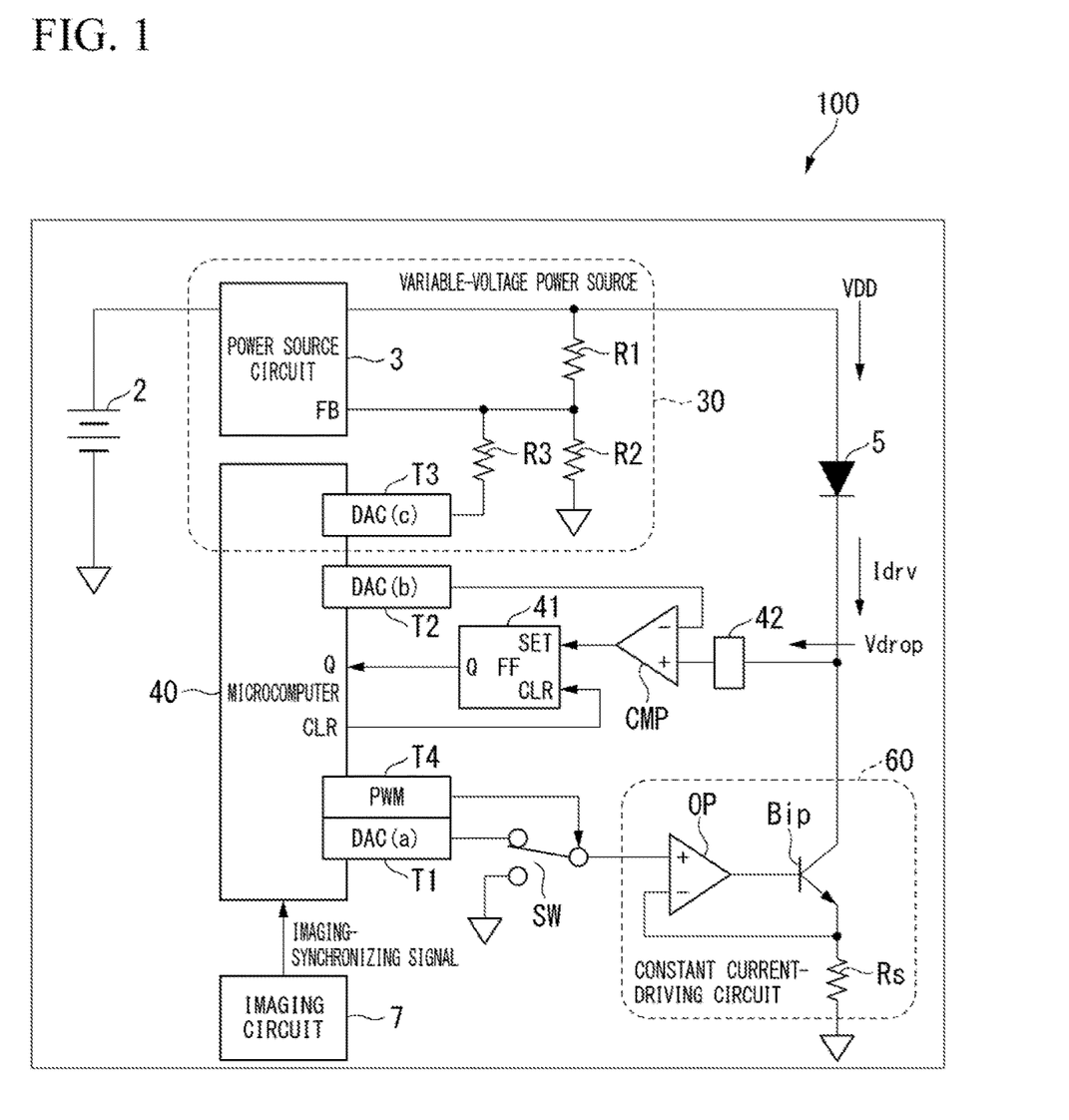
FIG. 1 is a block diagram showing an example of a configuration of an imaging device according to a first embodiment of the present invention.

Hereinafter, a first embodiment of the present invention will be described with reference to the drawings. FIG. 1 is a block diagram showing an example of a configuration of an imaging device according to the first embodiment of the present invention.

The imaging device 100 shown in FIG. 1 includes an imaging circuit 7, a variable-voltage power source 30, a light-emitting element 5, a constant current-driving circuit 60, and a microcomputer 40 (control circuit).

The output terminal of the variable-voltage power source 30 is connected to the input terminal of the light-emitting element 5 and the output terminal of the light-emitting element 5 is connected to the input terminal of the constant current-driving circuit 60.

The variable-voltage power source 30 includes a power source circuit 3, a resistance element R1, a resistance element R2, and a resistance element R3. The power source circuit 3 converts the direct-current (DC) voltage accumulated in a battery 2 into power source voltage and applies the converted power source voltage VDD to the light-emitting element 5. Hereinafter, the power source voltage VDD may be called a driving voltage. The resistance element R1 and the resistance element R2 are connected in serial to each other between the power source voltage VDD and GND (ground). The common contact of the resistance element R1 and the resistance element R2 connected in serial to each other is connected to the terminal FB of the power source circuit 3. In addition, the resistance element R3 is provided between the common contact and a terminal T3 of the microcomputer 40 that outputs voltage DAC(c). In other words, the power source circuit 3 converts the DC voltage accumulated in the battery 2 into the power source voltage in accordance with the voltage DAC(c) output by the microcomputer 40 and applies the converted power source voltage VDD to the light-emitting element 5. Thus, the power source circuit 3 increases the converted power source voltage VDD by reducing the output value of the voltage DAC(c) output by the microcomputer 40, while the power source circuit 3 reduces the converted power source voltage VDD by increasing the output value of the voltage DAC(c) output by the microcomputer 40.

The light-emitting element 5 is a semiconductor light-emitting element such as an LED or an LD. In other words, the light-emitting element 5 is a light-emitting diode (LED), is a kind of a diode, and is a semiconductor element that emits light when the forward voltage is applied. Alternatively, the light-emitting element 5 is a laser diode (LD) and is a semiconductor element. The center frequency at which light emitted from the semiconductor element oscillates, in other words, the color of laser light depends on a constituent element of the semiconductor.

The constant current-driving circuit 60 includes an operational amplifier OP, a bipolar transistor Bip, and a shunt resistor Rs.

The bipolar transistor Bip is an NPN-type bipolar transistor. The collector terminal of the bipolar transistor Bip is connected to the output terminal of the light-emitting element 5, the base terminal of the bipolar transistor Bip is connected to the output terminal of the operational amplifier OP, and the emitter terminal of the bipolar transistor Bip is connected to one end of the shunt resistor Rs. The other end of the shunt resistor Rs is connected to the ground. The positive electrode (+) terminal of the operational amplifier OP is connected to the output terminal of a switch SW and the negative electrode (−) terminal of the operational amplifier OP is connected to the common contact of the emitter terminal of the bipolar transistor Bip and one end of the shunt resistor Rs. The switch SW is configured to be a switch including two input terminals (a first input terminal and a second input terminal) and an output terminal, as shown in FIG. 1. The switch SW determines whether the first input terminal and the output terminal are connected (conducted) to each other or the second input terminal and the output terminal are connected to each other when the signal output from a terminal T4 of the microcomputer 40 is input to the output terminal.

The microcomputer 40 controls driving current Idrv flowing into the constant current-driving circuit 60. The microcomputer 40 controls a signal input to the + terminal of the operational amplifier OP in accordance with PWM (pulse-width modulation signal) that is output from the terminal T4 by the microcomputer 40 and is input to the output terminal of the switch SW. When the voltage value of the signal input to the + terminal of the operational amplifier OP is greater than the voltage value of the signal input to the − terminal of the operational amplifier OP, the constant current-driving circuit 60 amplifies the voltage value of the signal input to the + terminal and inputs the amplified voltage value to the base terminal of the bipolar transistor Bip. The voltage value of the signal input to the—terminal of the operational amplifier OP is the voltage value of the common contact of the emitter terminal of the bipolar transistor Bip and one end of the shunt resistor Rs. In this way, the constant current-driving circuit 60 controls the current (driving current of the light-emitting element 5) flowing from the collector terminal to the emitter terminal of the bipolar transistor Bip. In the description of the embodiment, the driving current Idrv of the light-emitting element 5 may be called pulse current flowing to the light-emitting element 5.

Here, an operation of the constant current-driving circuit 60 will be described with reference to FIG. 2.

Figure 2:
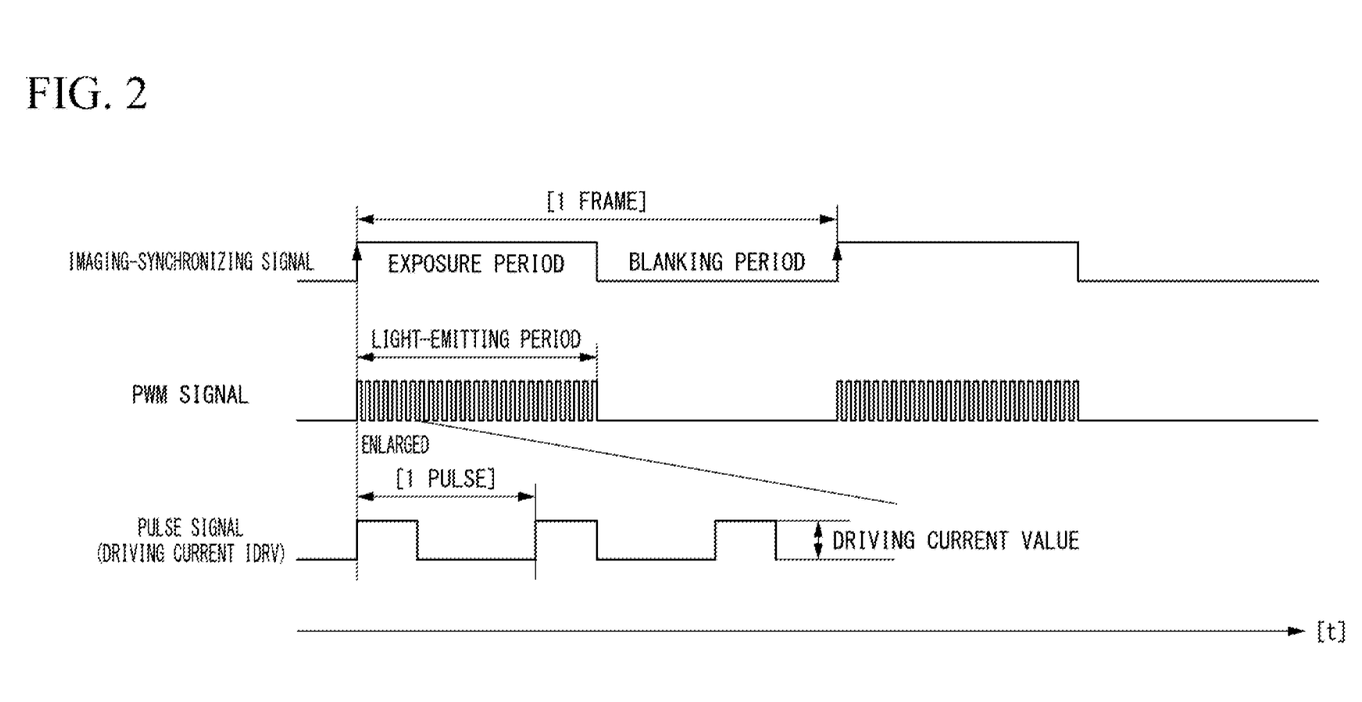
FIG. 2 is a timing chart showing an operation of a constant current-driving circuit shown in FIG. 1.

FIG. 2 is a tuning chart showing the operation of the constant current-driving circuit 60 shown in FIG. 1. In FIG. 2, an imaging-synchronizing signal output to the microcomputer 40 by the imaging circuit 7, the PWM signal output from the terminal T4 by the microcomputer 40, and the pulse current flowing to the light-emitting element 5 are shown.

The imaging circuit 7 has a predetermined exposure cycle (a cycle shown as 1 frame in FIG. 2) and a predetermined exposure period. The microcomputer 40 in the imaging device 100 controls the pulse current flowing to the constant current-driving circuit 60, turns on the light-emitting element 5 in a period (exposure period shown in FIG. 2) during which the imaging circuit 7 performs imaging, and turns off the light-emitting element 5 in a period (blanking period shown in FIG. 2) during which the imaging circuit 7 does not perform imaging. When the light-emitting element 5 is tuned on, the light-emitting element 5 emits light. When the light-emitting element 5 is tuned off, the light-emitting element 5 stops emitting light.

Therefore, the microcomputer 40 in the imaging device 100 outputs the PWM signal having predetermined duty from the output terminal T4 to the output terminal of the switch SW in a light-emitting period during which the light-emitting element 5 is maintained to be turned on, corresponding to the imaging period of the imaging circuit 7, as shown in FIG. 2. Here, the PWM signal having the predetermined duty is a signal having a period of a high level (H level) and a period of a low level (L level). For example, the period of the H level is a period of time obtained by multiplying the cycle including the period of the H level and a period of the L level by the predetermined duty. The period of the L level is the remaining period of the cycle. In the embodiment, the PWM may be ON when the PWM signal is in the H level and the PWM may be off when the PWM signal is in the L level.

In addition, the PWM signal is in the L level in a turning-off period during which the light-emitting element 5 is maintained to be turned off, corresponding to the blanking period of the imaging circuit 7, as shown in FIG. 2.

In other words, when the PWM signal input to the output terminal of the switch SW is in the H level, the switch SW becomes conductive between the first input terminal and the output terminal and the voltage DAC(a) (driving-current instruction value) output from a terminal T1 by the microcomputer 40 is input to the + terminal of the operational amplifier OP. On the other hand, when the PWM signal input to the output terminal of the switch SW is in the L level, the switch SW becomes conductive between the second input terminal and the output terminal and the voltage of the ground level (L level) connected to the second input terminal is input to the + terminal of the operational amplifier OP.

In this way, the constant current-driving circuit 60 causes the driving current Idrv consisting of a short pulse to flow in the light-emitting element 5 in the light-emitting period during which the light-emitting element 5 is maintained to be turned on, as shown in FIG. 2.

In other words, the constant current-driving circuit 60 causes the pulse current to flow in the light-emitting element 5 in accordance with the PWM (signal) output from a terminal T4 by the microcomputer 40 and the DAC(a) (driving-current instruction value) output from the terminal T1 by the microcomputer 40.

As shown in FIG. 1, the output terminal of the light-emitting element 5 and the input terminal (collector terminal of the bipolar transistor Bip) of the constant current-driving circuit 60 are connected to each other. The voltage level of this connected common contact point is called voltage drop Vdrop of the constant current-driving circuit 60.

As shown in FIG. 1, a voltage clip circuit 42 may be provided between the input terminal of the constant current-driving circuit 60 and the input terminal (positive electrode (+) terminal) of the comparator CMP. The comparator CMP is used when the microcomputer 40 controls the voltage applied by the variable-voltage power source 30 on the basis of the voltage of the input terminal of the constant current-driving circuit 60. The voltage clip circuit 42 is a circuit that clips the voltage of the input terminal of the comparator CMP to be predetermined voltage. The voltage clip circuit 42 is also a circuit called a voltage limiter circuit, a voltage clamp circuit, or the like. The voltage clip circuit 42 is a protection circuit that prevents overvoltage greater than or equal to the rated voltage of the comparator CMP from being applied to the comparator CMP. The overvoltage corresponds to the voltage drop Vdrop in the turning-off period of the light-emitting element 5. In the following description of the embodiment, it is assumed that the voltage of the input terminal (positive electrode (+) terminal) of the comparator CMP is the voltage drop Vdrop.

The positive electrode (+) terminal of the comparator CMP is connected to the input terminal of the constant current-driving circuit 60 and the voltage drop Vdrop of the constant current-driving circuit 60 is input to the positive electrode (+) terminal. The negative electrode (−) terminal of the comparator CMP is connected to a terminal T2 of the microcomputer 40 and voltage DAC(b) that is a predetermined value is input to the negative electrode (−) terminal. The terminal T2 of the microcomputer 40 outputs the voltage DAC(b) that is the predetermined value. The comparator CMP compares the voltage drop Vdrop with the voltage DAC(b).

The comparison result that is the output of the comparator CMP is input to an input terminal SET of a flip-flop (FF)

circuit 41. The flip-flop circuit 41 outputs a signal Q that is an output result to a Q terminal of the microcomputer 40 in accordance with the input comparison result.

In this way, the microcomputer 40 changes a Q value that is a determination result from 0 to 1 when the voltage drop Vdrop is greater than the voltage DAC(b) that is the predetermined value in the period during which the light-emitting element 5 is maintained to be turned on. The microcomputer 40 increases voltage DAC(c) to be input to the variable-voltage power source 30 and reduces the driving voltage (power source voltage VDD) of the light-emitting element 5. Thus, the microcomputer 40 performs control of causing the driving voltage (power source voltage VDD) of the light-emitting element 5 output by the variable-voltage power source 30 to near power source voltage VDD(M).

On the other hand, the microcomputer 40 maintains the Q value that is the determination result to be 0 as it is when the voltage drop Vdrop is less than or equal to the voltage DAC(b) that is the predetermined value in the period during which the light-emitting element 5 is maintained to be turned on. The microcomputer 40 reduces the voltage DAC(c) to be input to the variable-voltage power source 30 and increases the driving voltage (power source voltage VDD) of the light-emitting element 5. Thus, the microcomputer 40 performs control of causing the driving voltage (power source voltage VDD) of the light-emitting element 5 output by the variable-voltage power source 30 to near the power source voltage VDD(M).

In other words, the microcomputer 40 controls the voltage applied by the variable-voltage power source 30 on the basis of the voltage (voltage drop Vdrop) of the input terminal of the constant current-driving circuit 60 in the period during which the light-emitting element 5 is maintained to be turned on.

The microcomputer 40 controls the variable-voltage power source 30 and causes the variable-voltage power source 30 to apply voltage greater than or equal to the compliance voltage of the light-emitting element 5 (greater than or equal to the power source voltage VDD(M)) in the period during which the light-emitting element 5 is maintained to be turned off.

Figure 3:
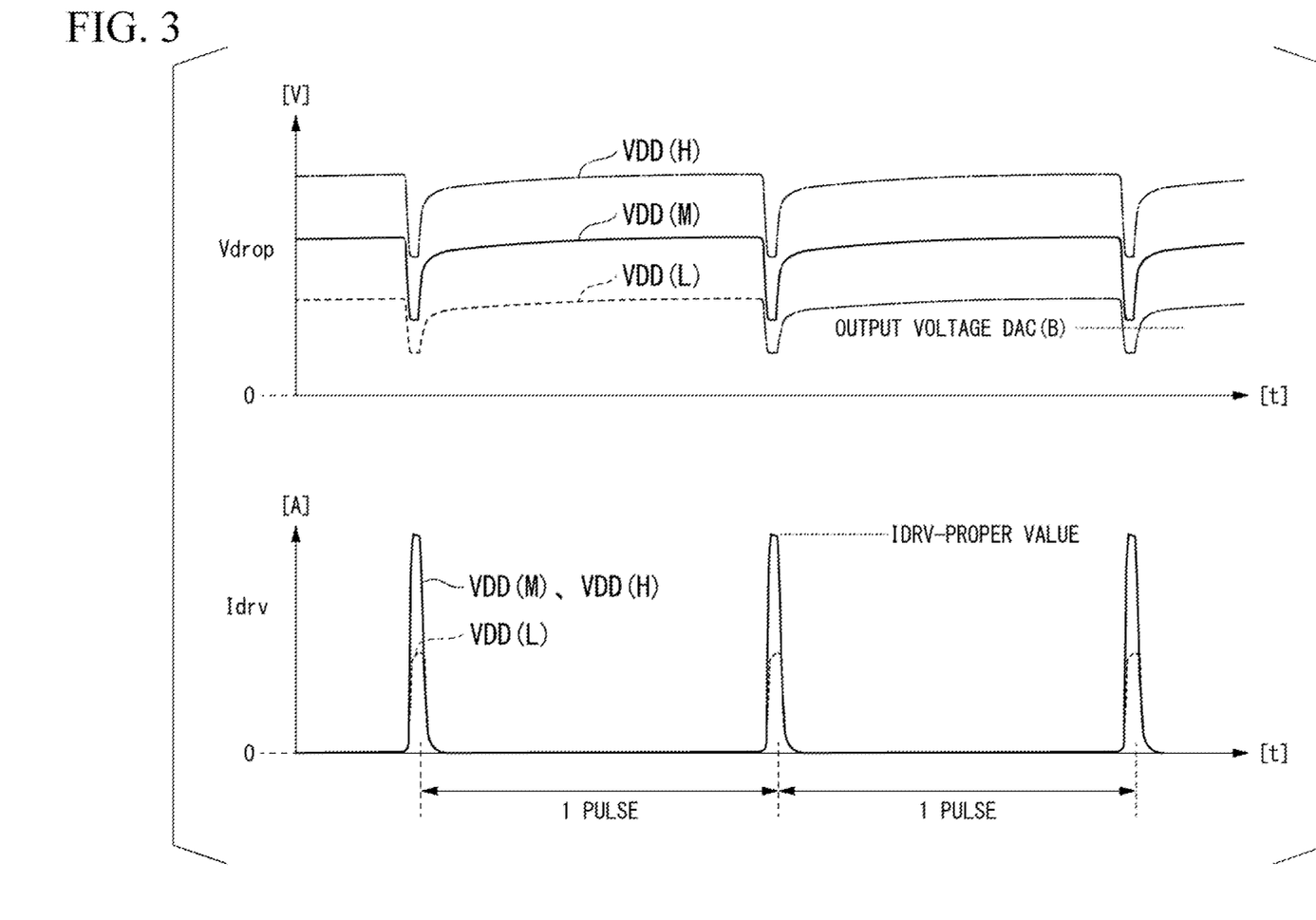
FIG. 3 is a timing chart showing an operation of the imaging device shown in FIG. 1.

Here, when the voltage drop Vdrop and the driving current Idrv in the constant current-driving circuit 60 are measured in the state in which the power source voltage VDD is in each of the high (H) level (power source voltage VDD(H)), the medium (M) level (power source voltage VDD(M)), and the low (L) level (power source voltage VDD(L)), waveforms shown in FIG. 3 are obtained. The power source voltage VDD(H) is greater than the power source voltage VDD(M) and the power source voltage VDD(M) is greater than the power source voltage VDD(L).

FIG. 3 is a timing chart showing an operation of the imaging device shown in FIG. 1. In FIG. 3, temporal change of the voltage drop Vdrop and the driving current Idrv in the period during which the microcomputer 40 maintains the light-emitting element 5 to be turned on is shown for each of the power source voltage VDD(H), the power source voltage VDD(M), and the power source voltage VDD(L). The waveform of the power source voltage VDD(H) is shown by a dashed-dotted line, the waveform of the power source voltage VDD(M) is shown by a solid line, and the waveform of the power source voltage VDD(L) is shown by a dotted line.

The power source voltage VDD(H) is greater than the voltage necessary for driving. Therefore, when the power source voltage VDD is at VDD(H), the driving current Idrv reaches an Idrv-proper value at the time of the H level of one pulse. Such a case is good, but the voltage drop Vdrop in such a case is high and the amount of power loss is large.

In addition, the power source voltage VDD(M) is almost the proper value. The reason is that the driving current Idrv is almost the proper value when the power source voltage VDD is at VDD(M), the voltage drop Vdrop in such a case is less than the power source voltage VDD(H), and the amount of power loss is smaller, compared to that when the power source voltage VDD is at VDD(H). Since the driving current Idrv reaches the Idrv-proper value at the time of the H level of one pulse, such a case is good.

In addition, the voltage is insufficient when the power source voltage VDD is at VDD(L). Therefore, when the driving current Idrv is at the H level of one pulse, the voltage drop Vdrop is less than the power source voltage VDD(M) and sufficient current (Idrv-proper value) is unable to flow.

Here, it is possible to obtain the voltage drop Vdrop of the constant current-driving circuit 60 as a predetermined value in advance on the basis of the characteristics of the bipolar transistor Bip constituting the constant current-driving circuit 60, the resistance value of the shunt resistor Rs, and the driving current Idrv. When the voltage drop Vdrop of the constant current-driving circuit 60 is the predetermined value, the amount of power loss is the smallest. Accordingly, it is possible to determine whether or not the power source voltage VDD is proper by measuring and determining the voltage drop Vdrop of the constant current-driving circuit 60.

In other words, as shown in FIG. 1 and FIG. 3, it is possible to define the DAC(b) output from the output terminal T2 by the microcomputer 40 as a predetermined value DAC(b), compare the voltage drop Vdrop with the predetermined value DAC(b), and determine whether or not the power source voltage VDD is proper power source voltage VDD(M) on the basis of the comparison result.

When the voltage drop Vdrop of the constant current-driving circuit 60 is less than the predetermined value DAC(b), it is possible to determine that the power source voltage VDD is insufficient. On the other hand, when the voltage drop Vdrop of the constant current-driving circuit 60 exceeds the predetermined value DAC(b), it is possible to determine that the power source voltage VDD is too high.

When the voltage drop Vdrop of the constant current-driving circuit 60 is compared with the predetermined value DAC(b), the comparator CMP described above is used. The microcomputer 40 outputs the predetermined value DAC(b) from the terminal T2 and sets the comparison result to the flip-flop circuit 41 (FF) described above. By using this method, it is possible to correctly perform comparison processing even in the driving using a short pulse of several microseconds.

When the microcomputer 40 determines that the power source voltage VDD is insufficient in the period during which the light-emitting element 5 is maintained to be turned on, the microcomputer 40 increases the power source voltage VDD by reducing the output value of the voltage DAC(c) output from the terminal T3, as described above. On the other hand, when the microcomputer 40 determines that the power source voltage VDD may be too high in the period during which the light-emitting element 5 is maintained to be turned on, the microcomputer 40 reduces the power source voltage VDD by increasing the output value of the voltage DAC(c). After time passes by several pulses of the pulse current that is the amplified current Idrv, the power source voltage VDD converges to the proper power source voltage VDD(M) soon.

When the turning-off period during which the light-emitting element 5 is maintained to be turned off is started, the microcomputer 40 stops driving the light-emitting element 5. In other words, the microcomputer 40 sets the PWM signal to be at the L level, as shown in FIG. 2, in the turning-off period (turning-off period having changed from the light-emitting period shown in FIG. 2) during which the light-emitting element 5 is maintained to be turned off, corresponding to the blanking period of the imaging circuit 7, as shown in FIG. 2. In addition, the microcomputer 40 stops changing the power source voltage VDD of the variable-voltage power source 30 in accordance with the result of comparing the voltage drop Vdrop of the constant current-driving circuit 60 with the predetermined value DAC(b). In other words, the power source voltage VDD is maintained since the microcomputer 40 does not change the output value of the voltage DAC(c) output from the terminal T3.

When the turning-on period is started again, light emission resumes in a state in which the power source voltage VDD is the proper power source voltage VDD(M) finally set in the turning-on period of last time.

Figure 4:
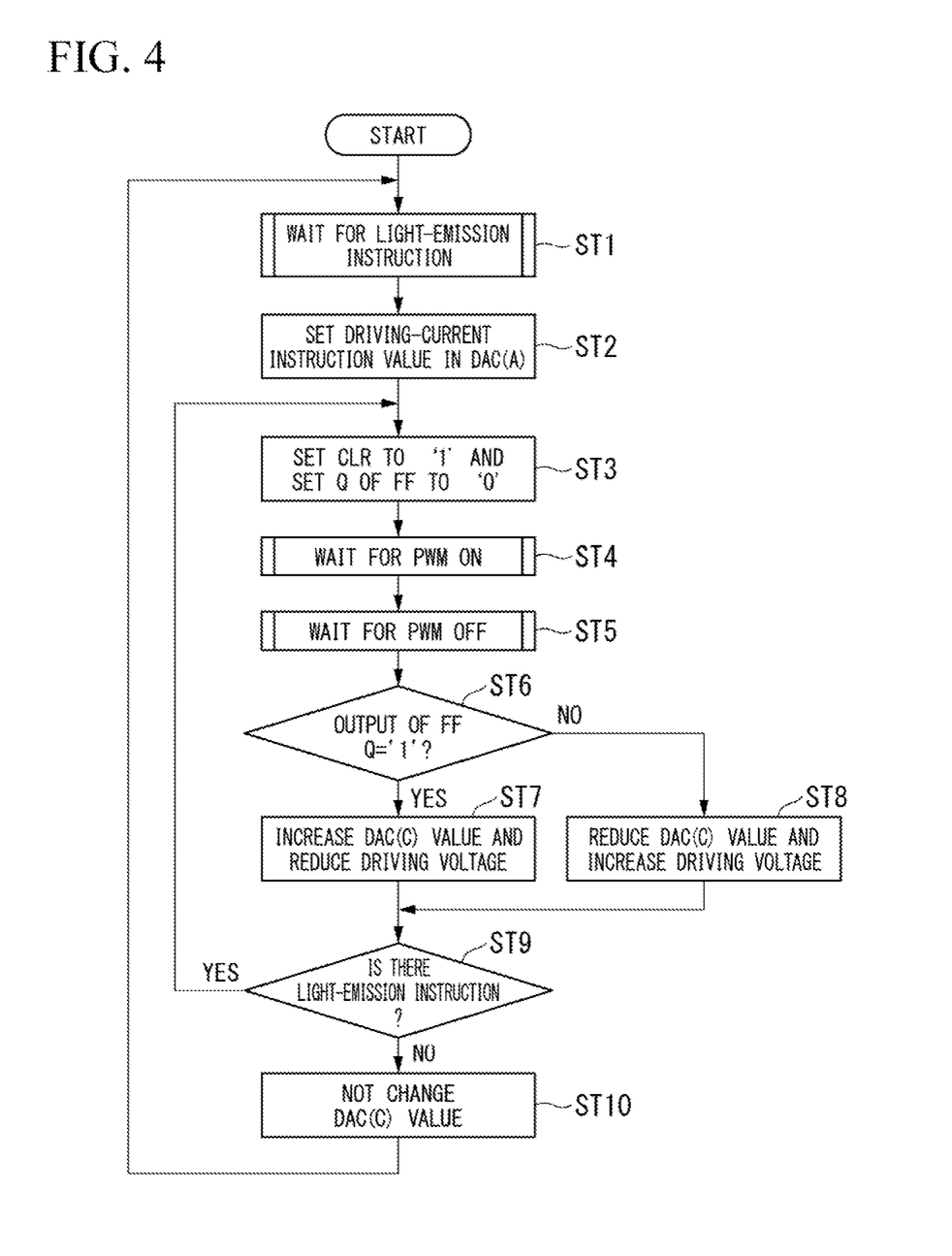
FIG. 4 is a flow chart showing processing of a control circuit shown in FIG. 1.

Next, processing in the microcomputer 40 will be described with reference to FIG. 4 shown as a flow chart. FIG. 4 is a flow chart showing the processing of the control circuit shown in FIG. 1.

The microcomputer 40 waits for a light-emission instruction (Step ST1). Specifically, the microcomputer 40 determines that the imaging circuit 7 has output the light-emission instruction when the imaging-synchronizing signal output by the imaging circuit 7 is at the H level. In this way, the light-emitting element 5 enters the turning-on period.

The microcomputer 40 sets the driving-current instruction value in the DAC(a) (Step ST2). Specifically, the microcomputer 40 sets a voltage value DAC(a) in the terminal T1. Here, the voltage value DAC(a) is a voltage value for causing the driving current (pulse current) of the constant current-driving circuit 60 to be the Idrv-proper value shown in FIG. 3 when the PWM signal is ON (H level).

The microcomputer 40 sets CLR to '1' and sets Q of the FF to '0' (Step ST3). Specifically, the microcomputer 40 changes the value of the output terminal CLR from '0' to '1', changes the value of the input terminal CLR of the flip-flop circuit 41 (FF) from '0' to '1', and changes the value of the output terminal Q of the flip-flop circuit 41 to '0.'

The microcomputer 40 waits for PWM ON (Step ST4). Specifically, the microcomputer 40 transmits the PWM signal of the H level from the terminal T4 to the switch SW and the constant current-driving circuit 60 causes the driving current Idrv (pulse current) having the optimal value corresponding to the voltage value DAC(a) set in the terminal T1 to flow in the light-emitting element 5. The comparator CMP compares the voltage drop Vdrop when the driving current Idrv having the optimal value flows, in other words, the PWM signal is at the H level with the predetermined value DAC(b) output from the terminal T2 by the microcomputer 40. When the voltage drop Vdrop is greater than the predetermined value DAC(b), the comparator CMP causes the Q value that is the determination result output from the output terminal Q of the flip-flop circuit 41 to change from 0 to 1.

On the other hand, when the voltage drop Vdrop is less than or equal to the predetermined value DAC(b), the comparator CMP causes the Q value that is the determination result output from the output terminal Q of the flip-flop circuit 41 to be maintained as 0.

Next, the microcomputer 40 waits for PWM OFF (Step ST5). Specifically, the microcomputer 40 transmits the PWM signal of the L level from the terminal T4 to the switch SW and the constant current-driving circuit 60 causes the driving current Idrv (pulse current) of 0A corresponding to the ground level of the second input terminal of the switch SW to flow in the light-emitting element 5. The driving current Idrv of 0A flows as with the case in which the light-emitting element 5 is in the turning-off period. The comparator CMP does not compare the voltage drop Vdrop when the driving current Idrv of 0A flows, in other words, the PWM signal is at the L level with the predetermined value DAC(b) output from the terminal T2 by the microcomputer 40. When the PWM signal is at the L level, the voltage drop Vdrop is greater than the predetermined value DAC(b), as shown in FIG. 3. In such a case, the comparator CMP causes the Q value that is the determination result output from the output terminal Q of the flip-flop circuit 41 to be maintained as 0, as with the case in which the PWM signal is at the H level and the voltage drop Vdrop is less than or equal to the predetermined value DAC(b).

The above-described processing of Step ST4 and Step ST5 is the processing of the comparator CMP controlled by the microcomputer 40 in a period of one pulse of the driving current (pulse current) shown in FIG. 3. The microcomputer 40 controls the variable-voltage power source 30 on the basis of the result of this processing, as described next.

The microcomputer 40 determines whether or not the output Q of the FF is '1' (Step ST6). Specifically, the microcomputer 40 determines whether the Q value output from the output terminal Q of the flip-flop circuit 41 and input to the input terminal Q is '1' or '0.'

When the determination result of Step ST6 indicates '1' (Step ST6—YES), the microcomputer 40 increases the DAC(c) value and reduces the driving voltage (Step ST7). Specifically, the microcomputer 40 determines that the power source voltage VDD is too high and controls the variable-voltage power source 30 by increasing the voltage DAC(c) output from the terminal T3, thus reducing the driving voltage (power source voltage VDD) that is the voltage for driving the light-emitting element 5.

On the other hand, when the determination result of Step ST6 indicates '0' (Step ST6—NO), the microcomputer 40 reduces the DAC(c) value and increases the driving voltage (Step ST8). Specifically, the microcomputer 40 determines that the power source voltage VDD is too low and controls the variable-voltage power source 30 by reducing the voltage DAC(c) output from the terminal T3, thus increasing the driving voltage (power source voltage VDD) that is the voltage for driving the light-emitting element 5.

In other words, the microcomputer 40 controls the voltage applied by the variable-voltage power source 30 and performs control of causing the power source voltage VDD to near power source voltage VDD(M) on the basis of the voltage (voltage drop Vdrop) of the input terminal of the constant current-driving circuit 60 in the period during which the light-emitting element 5 is maintained to be turned on.

Next, the microcomputer 40 determines whether or not there is a light-emission instruction (Step ST9). Specifically, the microcomputer 40 determines whether or not the imaging-synchronizing signal output by the imaging circuit 7 is at the H level and the imaging circuit 7 is outputting the light-emission instruction.

When the microcomputer 40 determines that the imaging circuit 7 is outputting the light-emission instruction (the light-emitting element 5 is turned on) (Step ST9—YES), the processing returns to Step ST3 and the processing of Steps ST3 to ST9 is executed. In other words, by executing the processing of the comparator CMP controlled by the microcomputer 40 in the period of one pulse of the driving current (pulse current) shown in FIG. 3 a plurality of times, in other words, when time passes by several pulses, it is possible to converge the power source voltage VDD in the period during which the light-emitting element 5 is maintained to be turned on to the proper power source voltage VDD(M).

On the other hand, when the microcomputer 40 determines that the imaging circuit 7 is not outputting the light-emission instruction (the light-emitting element 5 is turned off) (Step ST9—NO), the microcomputer 40 does not change the DAC(c) value (Step ST10). Specifically, the microcomputer 40 determines that the imaging-synchronizing signal is at the L level and the imaging circuit 7 is not outputting the light-emission instruction (the light-emitting element 5 is turned off) and does not change the voltage DAC(c) output from the terminal T3. When the turning-on period is started again, the microcomputer 40 controls the variable-voltage power source 30 by using the unchanged voltage DAC(c), applies to the light-emitting element 5 the power source voltage VDD that has converged to the proper power source voltage VDD(M) finally set in the turning-on period of last time, and therefore can resume the light emission of the light-emitting element 5.

Second Embodiment

Figure 5:
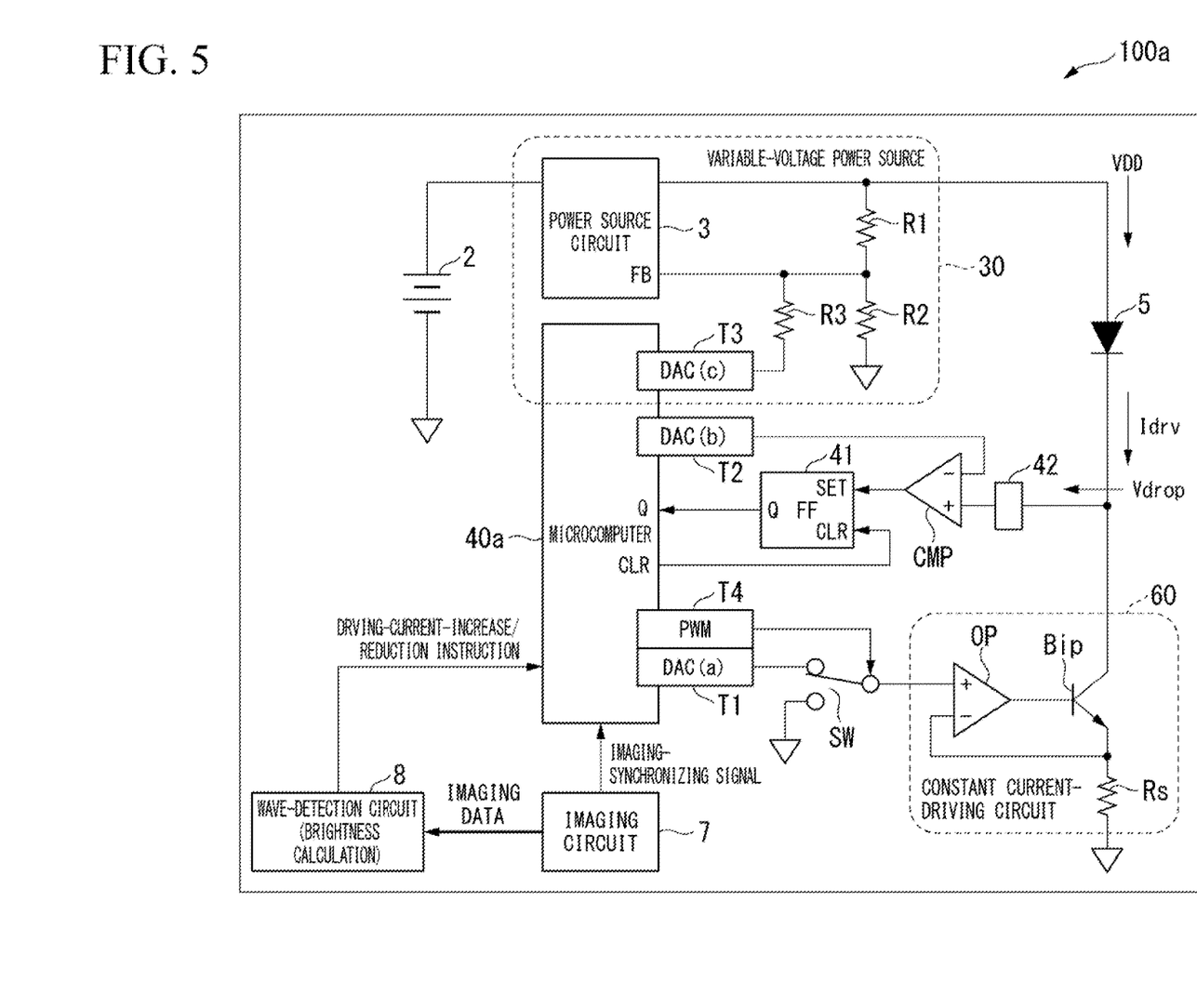
FIG. 5 is a block diagram showing an example of a configuration of an imaging device according to a second embodiment of the present invention.

Next, a second embodiment of the present invention will be described with reference to the drawings. FIG. 5 is a block diagram showing an example of a configuration of an imaging device according to the second embodiment of the present invention. In FIG. 5, the same reference numeral is given to the configuration the same as or corresponding to the configuration shown in FIG. 1 and a description thereof is omitted accordingly.

The imaging device 100a shown in FIG. 5 includes an imaging circuit 7, a wave-detection circuit 8, a variable-voltage power source 30, a light-emitting element 5, a constant current-driving circuit 60, and a microcomputer 40a (control circuit).

The wave-detection circuit 8 calculates and evaluates the brightness of the image (imaging data) captured by the imaging circuit 7. The wave-detection circuit 8 instructs the microcomputer 40a to increase and reduce the value of the driving current Idrv of the light-emitting element 5 in charge of illumination. Here, when the wave-detection circuit 8 evaluates or determines that the image captured by the imaging circuit 7 is dark, the wave-detection circuit 8 increases a driving-current instruction value DAC(a) output from the terminal T1 by the microcomputer 40a in order to increase the amount of the illumination light of the light-emitting element 5.

The driving-current instruction value DAC(a) increased by the microcomputer 40a is called a driving-current instruction value DAC'(a) in the embodiment.

In a case in which the driving-current instruction value DAC'(a) increases in the turning-off period of the light-emitting element 5 and the power source voltage VDD in the next turning-on period of the light-emitting element 5 is the same voltage (corresponding to the power source voltage VDD(M) in the first embodiment) as the voltage of the turning-on period of last time, the voltage drop Vdrop of the constant current-driving circuit 60 is insufficient and it is impossible to cause the sufficient driving current Idrv to flow in the light-emitting element 5. Therefore, the microcomputer 40a controls the variable-voltage power source 30 and causes the variable-voltage power source 30 to increase the power source voltage VDD(M) applied to the light-emitting element 5 by a certain value. Alternatively, the microcomputer 40a causes the variable-voltage power source 30 to increase the power source voltage VDD(M) to reach the output-upper-limit voltage of the variable-voltage power source 30. The increased power source voltage VDD(M) is called power source voltage VDD'(M) in the embodiment.

In other words, when the microcomputer 40a increases the driving-current instruction value DAC(a) to be the driving-current instruction value DAC'(a) in the turning-off period of the light-emitting element 5, the microcomputer 40a increases the voltage drop Vdrop of the constant current-driving circuit 60. This increased voltage drop Vdrop of the constant current-driving circuit 60 is called voltage drop Vdrop' in the embodiment.

In addition, the current flowing in the light-emitting element 5 in the next turning-on period of the light-emitting element 5 increases from the Idrv-proper value to be an Idrv'-proper value due to the voltage drop Vdrop' of the constant current-driving circuit 60.

Moreover, the microcomputer 40a has to increase the predetermined value DAC(b) output from the terminal T2 in accordance with the voltage drop Vdrop'. This predetermined value DAC(b) increased by the microcomputer 40a is called a predetermined value DAC'(b) in the embodiment.

In this way, the imaging device 100a in the embodiment further includes the wave-detection circuit 8 that calculates the brightness of the captured image obtained through the imaging performed by the imaging circuit 7 and the microcomputer 40a determines whether or not to increase the current flowing in the light-emitting element 5 on the basis of the brightness. When the microcomputer 40a determines that the current is to be increased, the microcomputer 40a controls the voltage applied by the variable-voltage power source 30 and causes the variable-voltage power source 30 to apply the voltage (power source voltage VDD'(M)) greater than the compliance voltage of the light-emitting element 5 in the period during which the light-emitting element 5 is maintained to be turned off.

Figure 6:
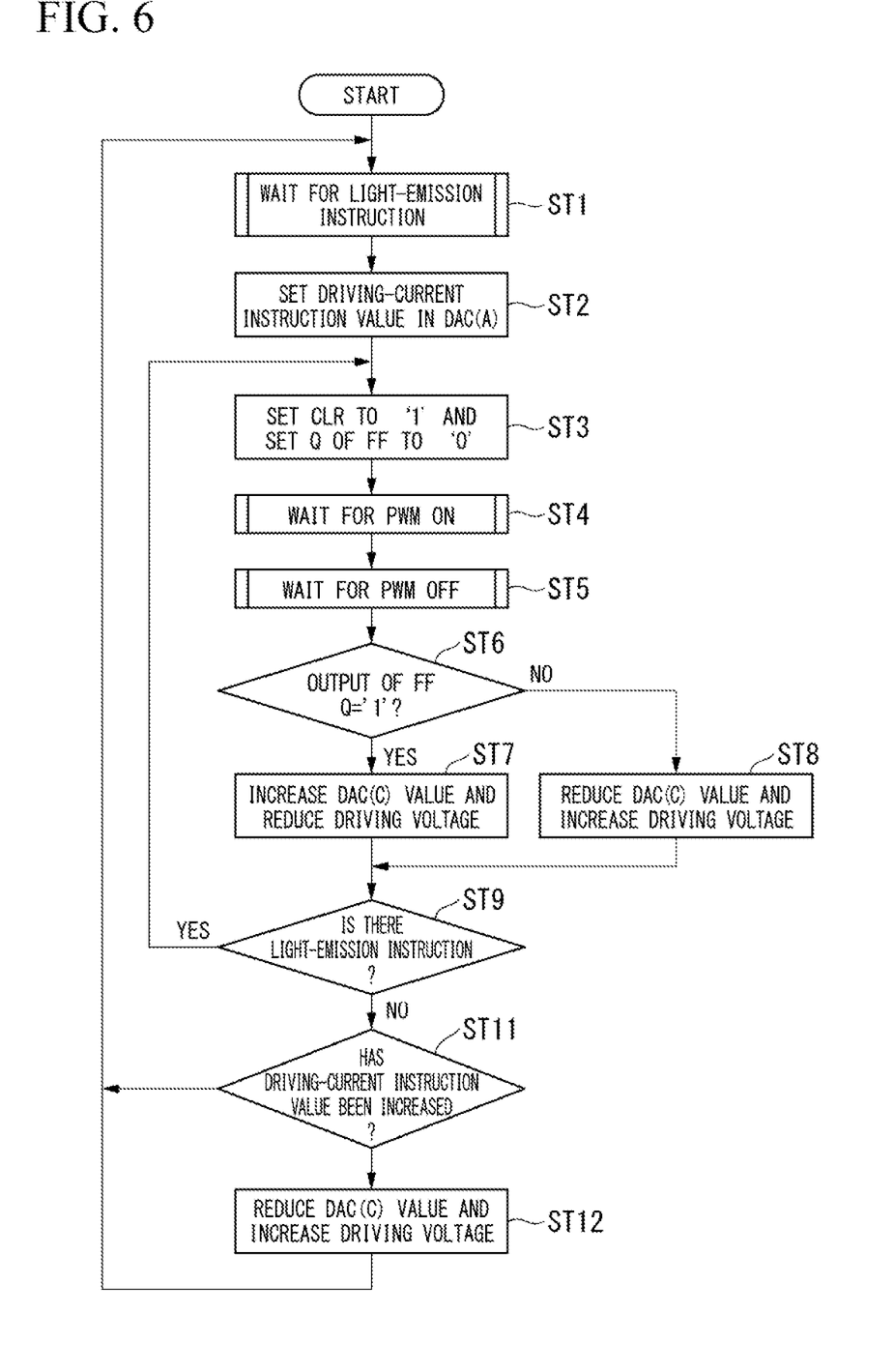
FIG. 6 is a flow chart showing processing of a control circuit shown in FIG. 5.

Next, processing in the microcomputer 40a will be described with reference to FIG. 6 shown as a flow chart. FIG. 6 is a flow chart showing the processing of the control circuit shown in FIG. 4.

The processing (Steps ST1 to ST9—YES) of the microcomputer 40a in the turning-on period of the light-emitting element 5 of the first time is the same as the processing of the microcomputer 40 shown in FIG. 4 and therefore a description thereof is omitted.

When the microcomputer 40a determines that the imaging circuit 7 is not outputting the light-emission instruction (the light-emitting element 5 is turned off) (Step ST9—NO), the microcomputer 40a determines whether or not the driving-current instruction value has been increased (Step ST11).

Specifically, the microcomputer 40a determines whether the DAC(a) output from the terminal T1 has been increased or the DAC(a) has not been increased (the DAC(a) has not changed or the DAC(a) has been reduced).

When the DAC(a) has not been increased (Step ST11—NO), the microcomputer 40a does not change the DAC(c) value (Step ST11—NO).

Specifically, the microcomputer 40a determines that the imaging-synchronizing signal is at the L level and the imaging circuit 7 is not outputting the light-emission instruction (the light-emitting element 5 is turned off) and does not change the voltage DAC(c) output from the terminal T3. When the turning-on period is started again, the microcomputer 40a controls the variable-voltage power source 30 by using the unchanged voltage DAC(c), applies to the light-emitting element 5 the power source voltage VDD that has converged to the proper power source voltage VDD(M) finally set in the turning-on period of last time, and therefore can resume the light emission of the light-emitting element 5 (Step ST1).

On the other hand, when the DAC(a) has been increased (Step ST11—YES), the microcomputer 40a reduces the DAC(c) value and increases the driving voltage (Step ST12).

Specifically, the microcomputer 40a determines that the imaging-synchronizing signal is at the L level and the imaging circuit 7 is not outputting the light-emission instruction (the light-emitting element 5 is turned off) and increases the voltage DAC(c) output from the terminal T3 to be the voltage DAC'(c). When the turning-on period is started again, the microcomputer 40a controls the variable-voltage power source 30 by using the increased voltage DAC'(c), applies to the light-emitting element 5 the proper power source voltage VDD'(M) that is the proper voltage in the next turning-on period, and therefore can resume the light emission of the light-emitting element 5 (Step ST1).

Hereinafter, the processing (the processing after the processing is changed from Step ST12 to Step ST1) in which the power source voltage VDD'(M) is applied to the light-emitting element 5 will be described.

The microcomputer 40a waits for a light-emission instruction (Step ST1). Specifically, the microcomputer 40a determines that the imaging circuit 7 has output the light-emission instruction when the imaging-synchronizing signal output by the imaging circuit 7 is at the H level. In this way, the light-emitting element 5 enters the turning-on period.

The microcomputer 40a sets the driving-current instruction value in the DAC(a) (Step ST2). Specifically, the microcomputer 40a sets a voltage value DAC'(a) in the terminal T1. Here, the voltage value DAC'(a) is a voltage value for causing the driving current (pulse current) of the constant current-driving circuit 60 to be the Idrv'-proper value when the PWM signal is ON (H level).

The microcomputer 40a sets CLR to '1' and sets Q of the FF to '0' (Step ST3). Specifically, the microcomputer 40a changes the value of the output terminal CLR from '0' to '1', changes the value of the input terminal CLR of the flip-flop circuit 41 (FF) from '0' to '1', and changes the value of the output terminal Q of the flip-flop circuit 41 to '0.'

The microcomputer 40a waits for PWM ON (Step ST4). Specifically, the microcomputer 40a transmits the PWM signal of the H level from the terminal T4 to the switch SW and the constant current-driving circuit 60 causes the Idrv'-proper value of the driving current Idrv (pulse current) corresponding to the voltage value DAC'(a) set in the terminal T1 to flow in the light-emitting element 5. The comparator CMP compares the voltage drop Vdrop' when the Idrv'-proper value of the driving current ldry flows, in other words, the PWM signal is at the H level with the predetermined value DAC'(b) output from the terminal T2 by the microcomputer 40a. When the voltage drop Vdrop' is greater than the predetermined value DAC'(b), the comparator CMP causes the Q value that is the determination result output from the output terminal Q of the flip-flop circuit 41 to change from 0 to 1.

On the other hand, when the voltage drop Vdrop' is less than or equal to the predetermined value DAC'(b), the comparator CMP causes the Q value that is the determination result output from the output terminal Q of the flip-flop circuit 41 to be maintained as 0.

Next, the microcomputer 40a waits for PWM OFF (Step ST5). Specifically, the microcomputer 40a transmits the PWM signal of the L level from the terminal T4 to the switch SW and the constant current-driving circuit 60 causes the driving current Idrv (pulse current) of 0A corresponding to the ground level of the second input terminal of the switch SW to flow in the light-emitting element 5. The driving current Idrv of 0A flows as with the case in which the light-emitting element 5 is in the turning-off period. The comparator CMP does not compare the voltage drop Vdrop' when the driving current Idrv of 0A flows, in other words, the PWM signal is at the L level with the predetermined value DAC'(b) output from the terminal T2 by the microcomputer 40a. When the PWM signal is at the L level, the voltage drop Vdrop' is greater than the predetermined value DAC'(b). In such a case, the comparator CMP causes the Q value that is the determination result output from the output terminal Q of the flip-flop circuit 41 to be maintained as 0, as with the case in which the PWM signal is at the H level and the voltage drop Vdrop' is less than or equal to the predetermined value DAC'(b).

The above-described processing of Step ST4 and Step ST5 is the processing of the comparator CMP controlled by the microcomputer 40a in a period of one pulse of the driving current (pulse current). The microcomputer 40a controls the variable-voltage power source 30 on the basis of the result of this processing, as described next.

The microcomputer 40a determines whether or not the output Q of the FF is '1' (Step ST6). Specifically, the microcomputer 40a determines whether the Q value output from the output terminal Q of the flip-flop circuit 41 and input to the input terminal Q is '1' or '0.'

When the determination result of Step ST6 indicates '1' (Step ST6—YES), the microcomputer 40a increases the DAC'(c) value and reduces the driving voltage (Step ST7). Specifically, the microcomputer 40a determines that the power source voltage VDD is too high and controls the variable-voltage power source 30 by increasing the voltage DAC'(c) output from the terminal T3, thus reducing the driving voltage (power source voltage VDD) that is the voltage for driving the light-emitting element 5.

On the other hand, when the determination result of Step ST6 indicates '0' (Step ST6—NO), the microcomputer 40a reduces the DAC'(c) value and increases the driving voltage (Step ST8). Specifically, the microcomputer 40a determines that the power source voltage VDD is too low and controls the variable-voltage power source 30 by reducing the voltage DAC'(c) output from the terminal T3, thus increasing the driving voltage (power source voltage VDD) that is the voltage for driving the light-emitting element 5.

In other words, the microcomputer 40a controls the voltage applied by the variable-voltage power source 30 and performs control of causing the power source voltage VDD to near power source voltage VDD'(M) on the basis of the voltage (voltage drop Vdrop') of the input terminal of the constant current-driving circuit 60 in the period during which the light-emitting element 5 is maintained to be turned on.

Next, the microcomputer 40a determines whether or not there is a light-emission instruction (Step ST9). Specifically, the microcomputer 40a determines whether or not the imaging-synchronizing signal output by the imaging circuit 7 is at the H level and the imaging circuit 7 is outputting the light-emission instruction.

When the microcomputer 40a determines that the imaging circuit 7 is outputting the light-emission instruction (the light-emitting element 5 is turned on) (Step ST9 —YES), the processing returns to Step ST3 and the processing of Steps ST3 to ST9 is executed. In other words, by executing the processing of the comparator CMP controlled by the microcomputer 40a in the period of one pulse of the driving current (pulse current) a plurality of times, in other words, when time passes by several pulses, it is possible to converge the power source voltage VDD in the period during which the light-emitting element 5 is maintained to be turned on to the proper power source voltage VDD'(M).

On the other hand, when the microcomputer 40a determines that the imaging circuit 7 is not outputting the light-emission instruction (the light-emitting element 5 is turned off) (Step ST9—NO), the microcomputer 40a determines whether or not the driving-current instruction value has been increased (Step ST11).

Specifically, the microcomputer 40a determines whether the DAC'(a) output from the terminal T1 has been increased or the DAC'(a) has not been increased (the DAC'(a) has not changed or the DAC'(a) has been reduced).

When the DAC'(a) has not been increased (Step ST11—NO), the microcomputer 40a does not change the DAC'(c) value (Step ST11—NO).

Specifically, the microcomputer 40a determines that the imaging-synchronizing signal is at the L level and the imaging circuit 7 is not outputting the light-emission instruction (the light-emitting element 5 is turned off) and does not change the voltage DAC'(c) output from the terminal T3. When the turning-on period is started again, the microcomputer 40a controls the variable-voltage power source 30 by using the unchanged voltage DAC'(c), applies to the light-emitting element 5 the power source voltage VDD that has converged to the proper power source voltage VDD'(M) finally set in the turning-on period of last time, and therefore can resume the light emission of the light-emitting element 5 (Step ST1).

On the other hand, when the DAC'(a) has been increased (Step ST11—YES), the microcomputer 40a reduces the DAC'(c) value and increases the driving voltage (Step ST12).

Specifically, the microcomputer 40a determines that the imaging-synchronizing signal is at the L level and the imaging circuit 7 is not outputting the light-emission instruction (the light-emitting element 5 is turned off) and increases the voltage DAC'(c) output from the terminal T3 to be the voltage DAC"(c). When the turning-on period is started again, the microcomputer 40a controls the variable-voltage power source 30 by using the increased voltage DAC"(c), applies to the light-emitting element 5 the proper power source voltage VDD"(M) that is the proper voltage in the next turning-on period, and therefore can resume the light emission of the light-emitting element 5 (Step ST1).

Modified Example of Second Embodiment

Next, a modified example of the second embodiment of the present invention will be described.

In the modified example of the second embodiment, the imaging device 100a shown in FIG. 5 further includes a memory (not shown in FIG. 5).

The memory stores first information indicating a relationship between the brightness calculated by the wave-detection circuit 8 and the voltage value (VDD(M)) applied by the variable-voltage power source 30.

In addition, the microcomputer 40a (control circuit) identifies the voltage applied by the variable-voltage power source 30 on the basis of the brightness and the first information. The microcomputer 40a controls the voltage applied by the variable-voltage power source 30 and causes the variable-voltage power source 30 to apply the identified voltage in the period during which the light-emitting element 5 is maintained to be turned off.

Here, the first information is data of results obtained by the imaging device 100a in the past. For example, when the microcomputer 40a controls the variable-voltage power source 30 on the basis of the data in accordance with the brightness, the variable-voltage power source 30 applies the power source voltage VDD(M) to the light-emitting element 5 and causes the light-emitting element 5 to emit light. The data are the DAC(a) applied to the constant current-driving circuit 60, the DAC(b) applied to the comparator CMP, and the DAC(c) applied to the variable-voltage power source 30.

In this way, in the imaging device 100a of the modified example, the microcomputer 40a can increase the power source voltage VDD(M) applied to the light-emitting element 5 with high accuracy, compared to the imaging device 100a of the second embodiment.

While preferred embodiments of the invention have been described and shown above, it should be understood that these are examples of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:
1. An imaging device comprising:
an imaging circuit;
a variable-voltage power source;
a light-emitting element;
a constant current-driving circuit; and
a control circuit,
wherein an output terminal of the variable-voltage power source is connected to an input terminal of the light-emitting element,
an output terminal of the light-emitting element is connected to an input terminal of the constant current-driving circuit, and
the control circuit is configured to:
output a pulse-width modulation signal to the constant current-driving circuit and control current flowing into the constant current-driving circuit so as to turn on the light-emitting element in a period during which the imaging circuit performs imaging;
stop outputting the pulse-width modulation signal to the constant current-driving circuit so as to turn off the light-emitting element in a period during which the imaging circuit does not perform imaging;
change driving voltage applied to the light-emitting element by the variable-voltage power source and perform control of causing the driving voltage to near predetermined power source voltage on the basis of voltage of the input terminal of the constant current-driving circuit in a period during which the light-emitting element is maintained to be turned on; and
control the variable-voltage power source and apply predetermined voltage greater than or equal to compliance voltage of the light-emitting element to the light-emitting element in a period during which the light-emitting element is maintained to be turned off.
2. The imaging device according to claim 1, further comprising a wave-detection circuit configured to calculate brightness of an image obtained through the imaging performed by the imaging circuit, wherein the control circuit is configured to:
- determine whether or not to increase current flowing in the light-emitting element on the basis of the brightness; and
- control the driving voltage and apply voltage greater than the compliance voltage to the light-emitting element in a period during which the light-emitting element is maintained to be turned off when the control circuit determines that the current is to be increased.

3. The imaging device according to claim 2, further comprising a memory configured to store information indicating a relationship between the brightness and a value of voltage applied by the variable-voltage power source,
wherein the control circuit is configured to:
- identify the voltage applied by the variable-voltage power source on the basis of the brightness and the information; and
- apply the identified voltage to the light-emitting element in the period during which the light-emitting element is maintained to be turned off.

4. The imaging device according to claim 1, further comprising a voltage clip circuit disposed between the input terminal of the constant current-driving circuit and an input terminal of a comparator used when the control circuit controls the driving voltage,
wherein the voltage clip circuit is configured to clip voltage of the input terminal of the comparator to be predetermined voltage.

5. The imaging device according to claim 1,
wherein the control circuit is configured to:
- apply, in the period during which the light-emitting element is maintained to be turned off, voltage applied to the light-emitting element at the end of a turn-on period of last time during which the light-emitting element is maintained to be turned on to the light-emitting element as the predetermined voltage; and
- apply, in the turn-on period of next time, the voltage applied to the light-emitting element at the end of the turn-on period of last time to the light-emitting element, thus resuming light emission.

* * * * *